Figure 1:
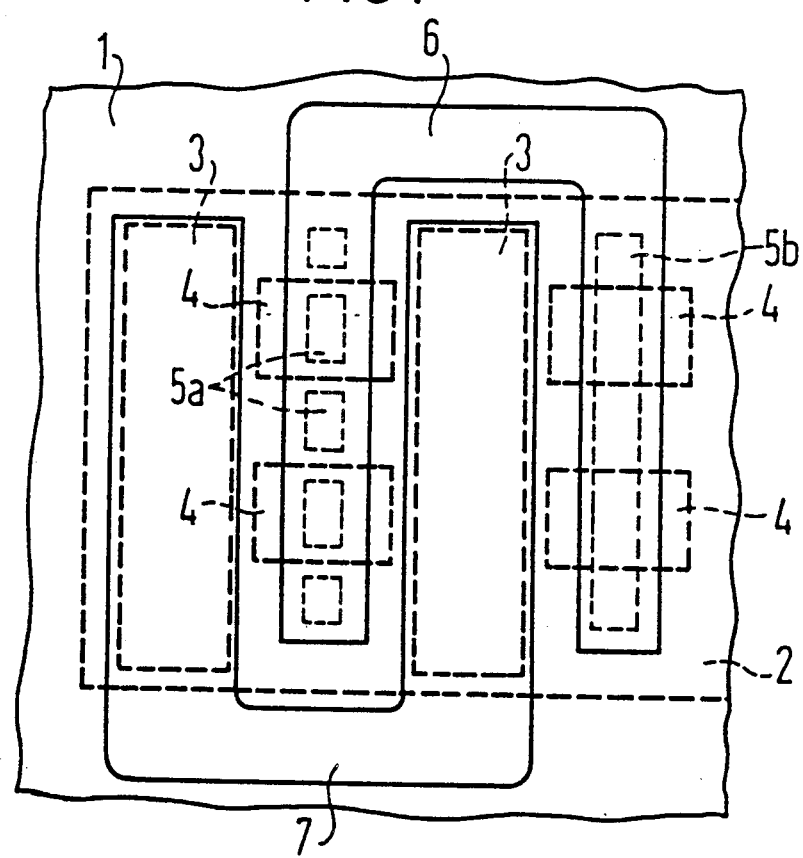

United States Patent [19]
Dathe et al.

[11] Patent Number: 5,003,367
[45] Date of Patent: Mar. 26, 1991

[54] SUCKING ELECTRODE FOR SHORTENING THE TURN-OFF TIME IN A SEMICONDUCTOR COMPONENT

[75] Inventors: Joachim Dathe; Margarete Deckers, both of Munich, Fed. Rep. of Germany

[73] Assignee: Siemens Aktiengesellschaft, Munich, Fed. Rep. of Germany

[21] Appl. No.: 246,505

[22] Filed: Sep. 19, 1988

[30] Foreign Application Priority Data

Sep. 23, 1987 [DE] Fed. Rep. of Germany ....... 3732074

[51] Int. Cl.$^5$ .......................................... H01L 29/74
[52] U.S. Cl. ...................................... 357/38; 357/34; 357/39
[58] Field of Search ............................. 357/38, 39, 34

[56] References Cited

U.S. PATENT DOCUMENTS

| | | |
|---|---|---|
| 3,510,735 | 5/1970 | Potter . |
| 4,205,332 | 5/1980 | Conti et al. ............................ 357/38 |
| 4,504,847 | 3/1985 | Nishizawa ............................ 357/38 |
| 4,516,149 | 5/1985 | Wakui et al. ............................ 557/38 |
| 4,543,593 | 9/1985 | Fujita ....................................... 357/38 |
| 4,607,273 | 8/1986 | Sakurada et al. ....................... 357/38 |
| 4,635,086 | 1/1987 | Miwa et al. ............................ 357/38 |
| 4,646,122 | 2/1987 | Kimura et al. ........................ 357/38 |
| 4,713,679 | 12/1987 | Terasawa et al. ..................... 357/38 |

FOREIGN PATENT DOCUMENTS 2802799 6/1984 Fed. Rep. of Germany .

OTHER PUBLICATIONS

IEEE Electron Device Letters, vol. EDL. 6, No. 11, Nov. 1985 (J. Narain) pp. 578, 579; "A Novel Method of Reducing the Storage Time of Transistors".

*Primary Examiner*—Rolf Hille
*Assistant Examiner*—Steven Loke
*Attorney, Agent, or Firm*—Herbert L. Lerner; Laurence A. Greenberg

[57] ABSTRACT

A sucking electrode for shortening the turn-off time in a semiconductor component includes a diffusion zone of the sucking electrode, a zone adjoining the diffusion zone of the sucking electrode defining a junction therebetween, and a metal short-circuit disposed between the diffusion zone of the sucking electrode and the zone adjoining the diffusion zone of the sucking electrode. The diffusion zone of the sucking electrode is disposed inside the zone adjoining the diffusion zone of the sucking electrode. At least a portion of the junction between the diffusion zone of the sucking electrode and the zone adjoining the diffusion zone of the sucking electrode is free of metal plating.

5 Claims, 1 Drawing Sheet

SUCKING ELECTRODE FOR SHORTENING THE TURN-OFF TIME IN A SEMICONDUCTOR COMPONENT

SPECIFICATION

The invention relates to a sucking electrode for shortening the turn-off time in a semiconductor component, including a diffusion zone of the sucking electrode and a metal short-circuit between the diffusion zone of the sucking electrode and a zone adjoining the diffusion zone of the sucking electrode.

More particularly, the invention relates to such semiconductor components manufactured as transistors, diodes or thyristors. At present, a short turn-off time is attained in switching transistors by means of intentional gold (Au) contamination. Due to the contamination with gold, the turn-off time is reduced through an increase of the recombination rate of the charge carriers in the semiconductor crystal.

This prior art method for shortening the switching time by means of an intentional gold contamination has the following disadvantages:

In the manufacture of semiconductor wafers, additional industrial steps are needed, for instance for the gold contamination. The gold contamination causes a major drop in the current amplification of the semiconductor component as well as a resultant non-linear course of this current amplification as a function of the collector current, an increase in the diode off-state currents, and an increase in the noise factor. The properties of the starting material in semiconductor component manufacture can fluctuate and since process parameters in the semiconductor component manufacturing process can also undergo certain fluctuations, differences in the gettering of the gold contaminations can arise, so that fluctuating switching times, fluctuating current amplifications, variable off-state currents and a variable signal-to-noise behavior of the transistors produced in this manner can occur.

In order to avoid these known disadvantages, it has already been proposed to provide additional emitter diffusion zones in the vicinity of the base, which are metallically short-circuited with the base and which "suck up" the base minority charge carriers, upon switch-over of the emitter-to-base diode from the on-state direction to the off-state direction.

Additional diffusion zones in the base region have already been described in the following publications:

(1) "A Novel Method of Reducing the Storage Time of Transistors" by J. Narian, in IEEE Electron Device Letters, Vol. EDL-6, No. 11, November, 1985;

(2) German Patent DE-PS 28 02 799, corresponding to U.S. Pat. No. 4,205,332 of M. Conti et al; and (3) U.S. Pat. No. 3,510,735 of G. B. Potter.

The additional emitter diffusion zones known from these three publications are substantially characterized by the following features:

In publications 1 and 2, the region of the additional diffusion is metallically short-circuited over its entire surface with the base region. This means that the metal overlaps the surface p-n junction of the additional diffusion zone and the base zone. This has the following disadvantages: The p-n junction of the additional diffusion zone and of the base zone is short-circuited through metal over the entire surface of the semiconductor component. The diffusion voltage, which is important for the sucking action of the additional diffusion zone, cannot be fully effective at the surface of the semiconductor component, where it would be at its highest because of the doping profile, without metallic short-circuiting between the additional diffusion zone and the base zone. At the surface of the semiconductor component, the sucking effect brought about by the additional diffusion for the minority charges in the base zone is consequently limited.

In the transistors known from publications 1 and 2, considerably more space is also required when using the additional diffusion zones, because a certain distance is necessary between the base metal plating and the emitter metal plating.

In publication 3, the additional diffusion zone is disposed as a pinch resistor around the base terminal and is spaced far apart from the emitter zone. As a result of this great distance from the emitter zone, the additional diffusion zone cannot suck the minority charge carriers out of the effective base underneath the emitter zone. The additional diffusion zone is therefore restricted in its action as a diffusion sink.

The structure of publication 3 also occupies more space, because of the additional diffusion zone.

In publication 3, the current output is limited because of the pinch resistor.

It is accordingly an object of the invention to provide a sucking electrode for shortening the turn-off time in a semiconductor component, which overcomes the herein afore-mentioned disadvantages of the heretofore-known devices of this general type and which has maximum efficiency while requiring minimum surface area.

With the foregoing and other objects in view there is provided, in accordance with the invention, a sucking electrode for shortening the turn-off time in a semiconductor component, comprising a diffusion zone of the sucking electrode, a zone adjoining the diffusion zone of the sucking electrode defining a junction therebetween, and a metal short-circuit disposed between the diffusion zone of the sucking electrode and the zone adjoining the diffusion zone of the sucking electrode, the diffusion zone of the sucking electrode being disposed inside the zone adjoining the diffusion zone of the sucking electrode, and at least a portion of the junction between the diffusion zone of the sucking electrode and the zone adjoining the diffusion zone of the sucking electrode being free of metal plating.

In accordance with another feature of the invention, the diffusion zone of the sucking electrode has at least one contact window for the metal short-circuit formed therein, whereby no metal is located directly on the junction between the diffusion zone of the sucking electrode and the zone adjoining the diffusion zone of the sucking electrode.

In accordance with a further feature of the invention, the diffusion zone of the sucking electrode and the zone adjoining the diffusion zone of the sucking electrode have at least one common contact window formed therein.

In accordance with an added feature of the invention, the semiconductor component is a transistor having a base diffusion zone and an emitter zone, the diffusion zone of the sucking electrode being disposed inside the base diffusion zone and having the same type of doping as the emitter zone.

In accordance with an additional feature of the invention, the semiconductor component is a diode.

In accordance with yet another feature of the invention, the semiconductor component is a thyristor.

In accordance with a concomitant feature of the invention, there is provided a further zone adjacent the zone adjoining the diffusion zone of the sucking electrode, the diffusion zone of the sucking electrode being spaced apart from the further zone by a distance great enough to avoid a short-circuit therebetween.

The mode of operation of an additional diffusion zone in semiconductor components, in particular in switching transistors, has already been described in publications 1 and 2.

The principle according to the invention is applicable both to transistors and diodes and to thyristors of any polarity for reducing the turn-off time.

Other features which are considered as characteristic for the invention are set forth in the appended claims.

Although the invention is illustrated and described herein as embodied in a sucking electrode for shortening the turn-off time in a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
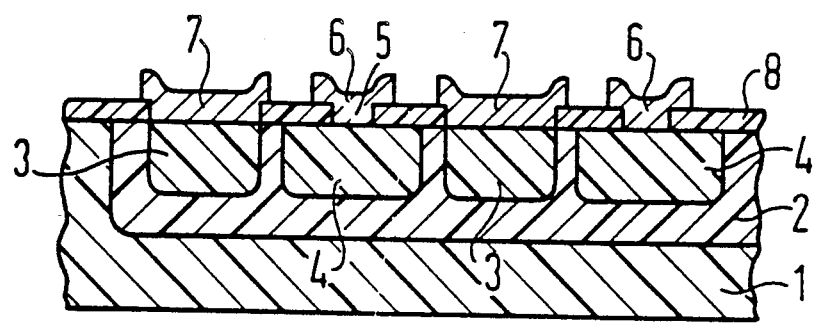

FIG. 1 is a fragmentary, diagrammatic, top-plan view of the surface of a switching transistor showing the structure of a sucking electrode according to the invention in a switching transistor: and FIG. 2 is a fragmentary, cross-sectional view of the switching transistor of FIG. 1.

Referring now in detail to FIGS. 1 and 2 of the drawing as a whole, there is seen a diagrammatic illustration of the principle of a sucking, sweeping-out or drawing-out electrode. A base zone 2 is located in a collector zone 1 An emitter zone 3 is located in the base zone 2. Diffusion zones 4 are disposed in the base zone 2. The diffusion zones 4 belong to the sucking electrode. These diffusion zones 4 have the same type of doping as the emitter zone 3. The diffusion zones 3 can therefore be manufactured simultaneously with the emitter zone 3. No additional industrial steps are therefore required for manufacturing the diffusion zones 4.

In order to bond the diffusion zones 4 and the base zone 2, different contact windows 5a and 5b can be provided. The contact windows 5a form separate contact windows for the base metal plating and for the metal plating of the sucking electrode. The contact window 5b forms a common contact window for the base metal plating and for the metal plating of the sucking electrode.

The base metal plating and the metal plating of the sucking electrode can be combined into a single base electrode 6. Emitter metal plating 7 can mesh in comb like fashion with the metal plating of the base electrode 6.

An insulating film 8 which may be formed of silicon dioxide and/or silicon nitride is disposed between the metal platings 6, 7 and the semiconductor surface.

The additional diffusion zones 4 in the vicinity of the base 2, which form the sucking electrode, can be electrically short-circuited with the base electrode 6 through the separate contact windows 5a, or through the common base and sucking electrode contact window 5b.

If only separate contact windows 5a are present, then this embodiment is distinguished by the fact that in the vicinity of the sucking electrode, a contact window for the base short circuit is opened in such a way that no metal is located directly on the p-n junction or transition between the base zone 2 and the diffusion zones 4 of the sucking electrode. The separate contact windows 5a have the advantage of permitting the diffusion voltage to be formed by means of an overlapping of metal in the vicinity of the surface of the semiconductor component as well, without interference. The possible diffusion voltage is greatest in the vicinity of the surface of the semiconductor component, because of the doping profile. However, separate contact windows 5a permit only small base terminal windows, which leads to an increase in the base resistance If the sucking electrodes and the base terminal have a common contact window 5b, then the majority of the sucking electrode is located outside the contact window 5b. A common base and sucking electrode contact window 5b has the advantage of providing a large base contact zone in comparison with an embodiment having separate contact windows 5a, which has a favorable effect in terms of a low base resistance. Even if a common base and sucking electrode contact window 5b is used in those zones in which the metal of the base electrode 6 rests directly on the p-n junction or transition of the sucking electrode and the base zone 2, so that the sucking of the minority charge carriers is interfered with because of the overlapping metal and the sucking action is restricted slightly, the shortening of the switching time is still considerable in comparison with the prior art, even if a common base and sucking electrode contact window 5b is used.

Whether separate contact windows 5a or one common contact window 5b is used, the sucking electrode requires no additional surface area. Despite the presence of the sucking electrode, the distance between the base metal plating 6 and the emitter metal plating can remain unchanged, in comparison with a semiconductor component lacking a sucking electrode. A slight spacing between the diffusion zones 4 for the sucking electrode and the emitter zone 3 is sufficient to avoid a short circuit between these zones.

The disposition and dimensioning of diffusion zones 4 of the sucking electrode and contact windows 5a or 5b can be selected in such a way that a minimally low base resistance and minimally short turn-off times can be attained, depending on the intended application.

The foregoing is a description corresponding in substance to German Application P 37 32 074.2, dated Sept. 23, 1987, the International priority of which is being claimed for the instant application, and which is hereby made part of this application. Any material discrepancies between the foregoing specification and the aforementioned corresponding German application are to be resolved in favor of the latter.

We claim:

1. Semiconductor component comprising a first semiconductor zone of a first conductivity, at least one second semiconductor zone of opposite conductivity within said first semiconductor zone, at least one third semiconductor zone of said opposite conductivity disposed within said first semiconductor zone and externally to said at least one second semiconductor zone forming a PN-junction between said first semiconductor zone and said third semiconductor zone, a sucking electrode for reducing turn-off time of said semiconductor component, a metallic short-circuit formed by said sucking electrode between said at least one third semiconductor zone and said first semiconductor zone, and wherein at least a part of said PN-junction is devoid of metal, and at least one open contact window disposed in said at least one third semiconductor zone, and wherein a greater part of said at least one third semiconductor zone is disposed externally to said at least one contact window.

2. Semiconductor component according to claim 1, wherein said contact window is disposed at least within said one third semiconductor zone so that said PN-junction is uncovered by metal.

3. Semiconductor component according to claim 1, including at least one other contact window being common to said first semiconductor zone and said at least one third semiconductor zone.

4. Semiconductor component according to claim 1, wherein said semiconductor component is a transistor and said first semiconductor zone 2 is a base diffusion zone.

5. Semiconductor element according to claim 1, wherein said third semiconductor zone and said second semiconductor zone are spaced apart a given distance just sufficient to avoid a short-circuit between said third and second semiconductor zones.

* * * * *